(12) United States Patent
Moriya

(10) Patent No.: US 8,962,156 B2
(45) Date of Patent: Feb. 24, 2015

(54) ORGANIC EL DEVICE, COLOR FILTER, AND ORGANIC EL DISPLAY

(75) Inventor: Norihisa Moriya, Tokyo-To (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 159 days.

(21) Appl. No.: 12/744,526

(22) PCT Filed: Nov. 28, 2008

(86) PCT No.: PCT/JP2008/071678
§ 371 (c)(1),
(2), (4) Date: Jun. 18, 2010

(87) PCT Pub. No.: WO2009/069760
PCT Pub. Date: Jun. 4, 2009

(65) Prior Publication Data
US 2010/0244011 A1    Sep. 30, 2010

(30) Foreign Application Priority Data
Nov. 29, 2007    (JP) ................ 2007-308208

(51) Int. Cl.
*H01L 51/52* (2006.01)
*G02B 5/23* (2006.01)
*H01L 27/32* (2006.01)
*C09K 11/06* (2006.01)
(Continued)

(52) U.S. Cl.
CPC .............. *H01L 27/322* (2013.01); *C09K 11/06* (2013.01); *H05B 33/14* (2013.01); *G02B 5/223* (2013.01); *H01L 51/0052* (2013.01); *H01L 51/0054* (2013.01); *H01L 51/0064* (2013.01); *H01L 51/0073* (2013.01); *H01L 51/0085* (2013.01); *Y10S 428/917* (2013.01)

USPC ........ 428/690; 428/917; 428/411.1; 428/336; 548/361.1

(58) Field of Classification Search
None
See application file for complete search history.

(56) References Cited

U.S. PATENT DOCUMENTS 6,280,890 B1    8/2001    Sawamura et al.
7,542,110 B2    6/2009    Maeda et al.
(Continued)

FOREIGN PATENT DOCUMENTS

JP    2001-141922 A1    5/2001
JP    2002-296412 A1    10/2002
(Continued)

OTHER PUBLICATIONS

Japanese Office Action dated Jan. 11, 2013 (with English translation).
(Continued)

*Primary Examiner* — J. L. Yang
(74) *Attorney, Agent, or Firm* — Burr & Brown, PLLC

(57) ABSTRACT

An organic EL device includes an organic EL emitter that emits blue light and a blue color filter through which the light emitted from the organic EL emitter passes. The blue color filter contains a coloring material selected from the group consisting of a triarylmethane dye, a lake pigment, a copper-phthalocyanine pigment, and a mixture of a copper-phthalocyanine pigment and a dioxazine pigment. The chromaticity of the light that has passed through the blue color filter after being emitted from the organic EL emitter, is in the range defined by lines connecting three chromaticity coordinates (0.150, 0.060), (0.143, 0.031), and (0.130, 0.049) on the CIE chromaticity diagram.

3 Claims, 7 Drawing Sheets

(51) Int. Cl.
*H05B 33/14* (2006.01)
*G02B 5/22* (2006.01)
*H01L 51/00* (2006.01)

(56) References Cited

U.S. PATENT DOCUMENTS

| | | | |
|---|---|---|---|
| 2006/0163989 A1* | 7/2006 | Kawaguchi et al. | 313/112 |
| 2008/0112069 A1* | 5/2008 | Helber et al. | 359/891 |
| 2008/0116790 A1* | 5/2008 | Kho et al. | 313/504 |
| 2009/0213295 A1 | 8/2009 | De Vaan | |
| 2010/0244010 A1* | 9/2010 | Moriya | 257/40 |

FOREIGN PATENT DOCUMENTS

| | | |
|---|---|---|
| JP | 2003-045659 A1 | 2/2003 |
| JP | 2003-121838 A1 | 4/2003 |
| JP | 2003-249366 A1 | 9/2003 |
| JP | 2004-273317 A1 | 9/2004 |
| JP | 2004-341245 A1 | 12/2004 |
| JP | 2005-255754 A1 | 9/2005 |
| JP | 2005-309306 A1 | 11/2005 |
| JP | 2006-196532 A1 | 7/2006 |
| JP | 2006-276512 A1 | 10/2006 |
| JP | WO 2006/106826 A1 | 10/2006 |
| JP | 2007-018902 A1 | 1/2007 |
| JP | 2007-134693 A1 | 5/2007 |
| JP | 2007-534021 A1 | 11/2007 |

OTHER PUBLICATIONS

Japanese Office Action (with English translation) (Application No. 2009-543876) dated Oct. 11, 2013.

* cited by examiner

ORGANIC EL DEVICE, COLOR FILTER, AND ORGANIC EL DISPLAY

FIELD OF THE INVENTION

The present invention relates to an organic EL device, to a color filter, and to an organic EL display.

BACKGROUND OF THE INVENTION

In recent years, electroluminescent (hereinafter abbreviated to EL) displays composed of EL devices have been expected as displays of the next generation. EL devices are classified into inorganic EL devices and organic EL devices. Since both inorganic and organic EL devices are self-light-emissive (self-light-luminescent), they have the advantage of providing high visibility. Moreover, EL devices, either inorganic or organic, are fully solid-state devices, so that they also have the advantages of having high resistance to impact and of being easy to handle. For these reasons, research is being carried out to attempt to use EL devices practically as pixels on graphic displays, pixels on TV image displays, surface light sources, and so forth.

An organic EL device is a structure in which a laminate of a light-emitting layer made from a fluorescent organic solid such as anthracene and a hole-injection layer made from a triphenylamine derivative or the like, a laminate of a light-emitting layer and an electron-injection layer made from a perylene derivative or the like, or a laminate of a hole-injection layer, a light-emitting layer, and an electron-injection layer, is sandwiched between a pair of electrodes. Of the two electrodes, the one to be situated on the emission surface side is made of a transparent electrode. Such an organic EL device makes use of emission that takes place at the instance electrons and holes injected into the light-emitting layer recombine with each other. Therefore, the organic EL device comes to be operable at a voltage of as low as e.g., 4.5 V, if the thickness of the light-emitting layer is made smaller. This leads to higher speed of response, and also makes it possible to provide high-luminosity EL devices because the luminosity is proportional to the injection current. Furthermore, by changing the type of the fluorescent organic solid to be used for the light-emitting layer, it is possible to obtain emission in all colors in the visible range of blue, green, yellow, and red. Since organic EL devices have the above-described advantages, especially the advantage of being operable at low voltages, studies are now made to put them in practical use, and some organic EL devices have already been practically used for small-sized displays that can be produced relatively easily, such as displays of mobile phones.

Methods with which organic EL devices can attain color display include: (1) the three-color-films-coating method (three-color-films-deposition method) in which films of three luminescent materials that emit lights of three different colors such as blue, red, and green are applied (deposit); (2) the color conversion method (CCM) in which a blue-light-emitting layer is used in combination with a color changing layer (CCM layer) for conversion of color from blue to green and a color changing layer (CCM layer) for conversion of color from blue to red to develop three colors; and (3) the method in which a white-light-emitting layer is used in combination with color filters of blue, red, green, etc. Of these methods, the three-color-films-coating method (1) is most promising if luminous efficiency is taken into account, and has been practically used in the production of mobile phones, personal digital assistants (PDAs), and so on.

These organic EL devices have had the following problem: they have electrodes made from metallic materials, so that when displays composed of organic EL devices are used in bright circumstances, the display contrast is remarkably lowered due to reflection of extraneous light (outside light). In order to cope with this problem, various measures including (A) attaching a circular polarizer to the man-side surface of an organic EL device, (B) using a color filter, and (C) tinting an organic EL device with an achromatic or nearly achromatic color (carrying out so-called tint treatment) are usually taken.

Theoretically, the above measure (A), attaching a circular polarizer to an organic EL device, makes it possible to prevent reflection of extraneous light completely (though this depends also on the angle of incidence of extraneous light), but the circular polarizer absorbs more than half of the light emitted from the organic EL device as well. Thus, the measure (A) has not always been advantageous from the viewpoint of efficiency. On the other hand, the measure (B), using a color filter, is less effective than the use of a circular polarizer in prevention of reflection of extraneous light. However, the use of a color filter makes it possible to control the hue of the light emitted from the organic EL device. Since there are limitations on improvement in color purity by emission itself of organic EL devices, the hue-control function is considered to be quite effective. Particularly, the combination of the three-color-films-coating method and the use of a color filter is the best from the viewpoint of the balance of luminous efficiency, color purity, and prevention of reflection of extraneous light, and organic EL devices produced by using this combination have actually been commercialized.

Incidentally, the EBU (European Broadcasting Union) Standard (the technical standard created by the European Broadcasting Union consisting of broadcasting stations in Europe and north Africa) is widely used. One of the items of evaluation of the performance of a display is whether or not the display has a color reproduction range that fulfills the EBU Standard. Specifically, the proportion of the area of the triangular color reproduction range of a display to be evaluated, relative to the area of the triangle on the CIE (Commission Internationale de l'Eclairage) chromaticity diagram, specified in the EBU Standard, is used to evaluate the performance of the display. That is to say, the performance of a display is shown by the value [the area of the triangular color reproduction range of the display to be evaluated]/[the area of the triangle specified in the EBU Standard]×100(%). This proportion is so-called "EBU proportion" and is widely accepted as the value showing display performance.

On the other hand, in the evaluation using the EBU proportion, the chromaticity itself of each color of red, green, or blue that a display reproduces is not required to meet the chromaticity specified in the EBU Standard. Therefore, even if a display has an EBU proportion of 100% or more, not all the color tones specified in the EBU Standard can be reproduced by the display.

Patent documents concerning liquid crystal displays, referring to the EBU Standard, include Japanese Laid-Open Patent Publications No. 2003-121838 and No. 2005-309306.

As described above, it becomes possible to make hue adjustment when organic EL devices are combined with color filters. However, in the production of full-color organic EL displays using organic EL devices, enlargement of color reproduction range has come to be strongly demanded like in CRT displays and LCDs, as display contents get complicated and peripheral apparatus become sophisticated. More specifically, there is a demand for organic EL displays that can fully meet the color reproduction range specified in the EBU Standard.

SUMMARY OF THE INVENTION

The present invention was accomplished in order to meet the above demand. An object of the present invention is to provide an organic EL device that makes it possible to meet completely the color reproduction range specified in the EBU Standard. Another object of the present invention is to provide an organic EL display comprising the above organic EL device. A further object of the present invention is to provide a color filter for making it possible to meet completely the color reproduction range specified in the EBU Standard.

An organic EL device according to the present invention that fulfills the above objects comprises an organic EL emitter that emits blue light and a blue color filter through which the light emitted from the organic EL emitter passes, wherein the chromaticity of the light, the light that has passed through the blue color filter after emitted from the organic EL emitter, falls in the range defined by lines connecting three chromaticity coordinates (0.150, 0.060), (0.143, 0.031), and (0.130, 0.049) on the CIE chromaticity diagram.

According to the present invention, light whose chromaticity is in the above-described range on the CIE chromaticity diagram can be emitted from the organic EL device including an organic EL emitter that emits blue light and a blue color filter. Such an organic EL device that emits blue light can cover the whole range specified in the EBU Standard, when combined with a suitable organic EL device that emits green light and a suitable organic EL device that emits red light. Thus, the organic EL device of the invention can compose an organic EL display excellent in color reproduction range.

In the organic EL device according to the present invention, it is preferred that the blue color filter include a coloring material selected from the group consisting of a triarylmethane dye, a lake pigment, a copper-phthalocyanine pigment, and a mixture of a copper-phthalocyanine pigment and a dioxazine pigment.

In the production of liquid crystal displays, since high temperatures are exerted when alignment films are formed, it has been impossible to use dyes, which are coloring materials poor in heat resistance. It was however found that, in organic EL devices, which require no alignment films, it is possible to use dyes, which are more excellent than pigments in transmission, and that particularly triarylmethane dyes can be favorably used. It was also found that the use of lake pigments, particularly the use of lake pigments made from triaryl dyes, makes it possible to ensure higher resistance to heat and light.

A color filter according to the present invention that fulfills the above objects is one to be combined with an organic EL emitter that emits blue light so as to compose an organic EL device, and the color filter includes a binder resin and a coloring material wherein the chromaticity of the light, the light that has passed through the blue color filter after emitted from the organic EL emitter, falls in the range defined by lines connecting three chromaticity coordinates (0.150, 0.060), (0.143, 0.031), and (0.130, 0.049) on the CIE chromaticity diagram.

The color filter of the invention, with an organic EL emitter that emits blue light, can compose an organic EL device that emits light whose chromaticity is in the above-described range on the CIE chromaticity diagram. Such an organic EL device that emits blue light can cover the whole range specified in the EBU Standard, when combined with a suitable organic EL device that emits green light and a suitable organic EL device that emits red light. Thus, the organic EL device can compose an organic EL display excellent in color reproduction range.

In the color filter according to the present invention, it is preferable to select the coloring material from the group consisting of a triarylmethane dye, a lake, a copper-phthalocyanine pigment, and a mixture of a copper-phthalocyanine pigment and a dioxazine pigment. In the production of liquid crystal displays, since high temperatures are exerted when alignment films are formed, it has been impossible to use dyes, which are coloring materials poor in heat resistance. It was however found that, in organic EL devices, which require no alignment films, it is possible to use dyes, which are more excellent than pigments in transmission, and that particularly triarylmethane dyes can be favorably used. It was also found that the use of lake pigments, particularly the use of lake pigments made from triaryl dyes, makes it possible to ensure higher resistance to heat and light.

An organic EL display according to the present invention that fulfills the above objects includes an organic EL device that emits red light, an organic EL device that emits green light, and an organic EL device that emits blue light, wherein the organic EL device that emits blue light includes an organic EL emitter that emits blue light and a blue color filter through which the light emitted from the organic EL emitter passes, and the chromaticity of the transmitted light, the light that has passed through the blue color filter after emitted from the organic EL emitter, falls in the range defined by lines connecting three chromaticity coordinates (0.150, 0.060), (0.143, 0.031), and (0.130, 0.049) on the CIE chromaticity diagram.

The organic EL display according to the present invention uses an organic EL device that can emit light whose chromaticity is within the above-described range on the CIE chromaticity diagram in combination with an organic EL device that emits green light and an organic EL device that emits red light. Therefore, if the organic EL device that emits green light and the organic EL device that emits red light emit specified lights, the organic EL display can cover the whole range specified in the EBU Standard. Thus, the present invention can provide an organic EL full-color display excellent in color reproduction range.

In the organic EL display according to the present invention it is preferred that the blue color filter include a coloring material selected from the group consisting of a triarylmethane dye, a lake pigment, a copper-phthalocyanine pigment, and a mixture of a copper-phthalocyanine pigment and a dioxazine pigment. In the production of liquid crystal displays, since high temperatures are exerted when alignment films are formed, it has been impossible to use dyes, which are coloring materials poor in heat resistance. It was however found that, in organic EL devices, which require no alignment films, it is possible to use dyes, which are more excellent than pigments in transmission, and that particularly triarylmethane dyes can be favorably used. It was also found that the use of lake pigments, particularly the use of lake pigments made from triaryl dyes, makes it possible to ensure higher resistance to heat and light.

The organic EL device, color filter, and organic color display according to the present invention make it possible to cover the whole range specified in the EBU Standard, when combined with a suitable organic EL device that emits green light and a suitable organic EL device that emits red light. Thus, the present invention can provide an organic EL display excellent in color reproduction range.

DETAILED DESCRIPTION OF THE INVENTION

Embodiments of the organic EL device and the organic EL display of the present invention will be described hereinafter. However, they should not be construed as limiting the present invention in any way.

[Organic EL Device]

Figure 1:
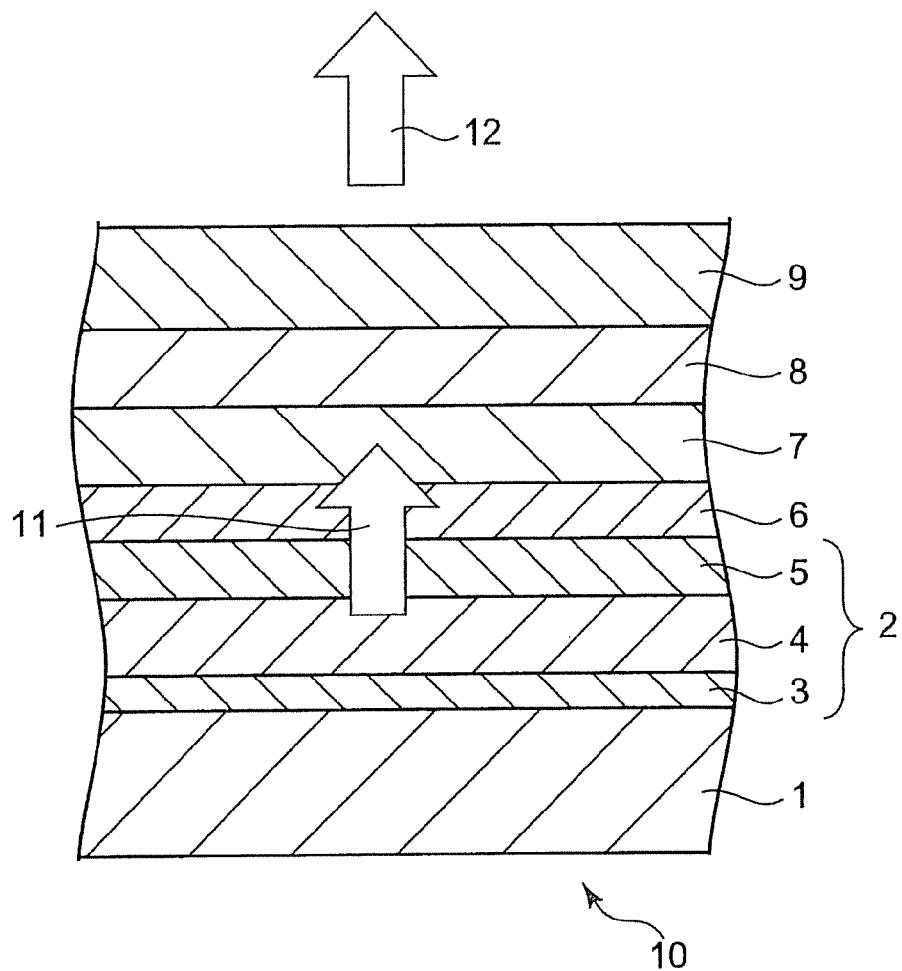
FIG. 1 is a diagrammatic sectional view showing an organic EL device in one embodiment of the present invention.

FIG. 1 is a view explaining an embodiment of the present invention; it is a diagrammatic sectional view illustrating an organic EL device of the invention. An organic EL device 10 is composed of an organic EL emitter (organic EL luminescent body, organic EL luminous body) 2 that emits blue light and a blue color filter 8. The chromaticity of the light 12 from the organic EL device 10 is present in the range defined by lines connecting three chromaticity coordinates (0.150, 0.060), (0.143, 0.031), and (0.130, 0.049) on the CIE chromaticity diagram. As shown in FIG. 1, in the organic EL device 10 in this embodiment, a substrate 1, an electrode 3, a blue-light-emitting layer 4, an electrode 5, a protective layer 6, an adhesive layer 7, a blue color filter 8, and a transparent substrate 9 are layered in the order named. Of these constituent layers, the electrode 3, the blue-light-emitting layer 4, and the electrode 5 make up the organic EL emitter (organic EL luminescent body, organic EL luminous body) 2. The constitution of the organic EL emitter 2 and the constitution of the blue color filter 8 will be described below.

(Organic EL Emitter)

The organic EL emitter 2 emits blue light 11, and the organic EL emitter 2 is composed of the electrode 3, the blue-light-emitting layer 4, and the electrode 5 that are layered in the order named as shown in FIG. 1. Any material, size, thickness, etc. can be selected for the substrate 1, and the selection can be made according to the intended use of the organic EL device, the materials for the layers to be layered on the substrate, and so forth. For example, any material selected from metals such as aluminum, glass, silica, and a variety of resins can be used for the substrate 1. The light emitted from the blue-light-emitting layer 4 goes out from the blue color filter 8 side of the organic EL device, so that it is not necessary to use a transparent or semitransparent material for the substrate 1, and an opaque material can also be used.

Although the electrode 3 may be either an anode or a cathode, the electrode 3 is usually formed on the substrate 1 as the anode. On the electrode 3, a hole-injection layer, a hole-transport layer and so on may be formed. Examples of materials useful for the electrode 3 include metals such as gold, silver, and chrome; transparent conductive films of ITO (indium tin oxide), indium oxide, IZO (indium zinc oxide), $SnO_2$, and ZnO; and conductive oxides of polyaniline and polyacetylene. The electrode 3 may also be a reflecting electrode having the lamination ITO/silver/ITO, as will be described later in Example 1.

Figure 2:
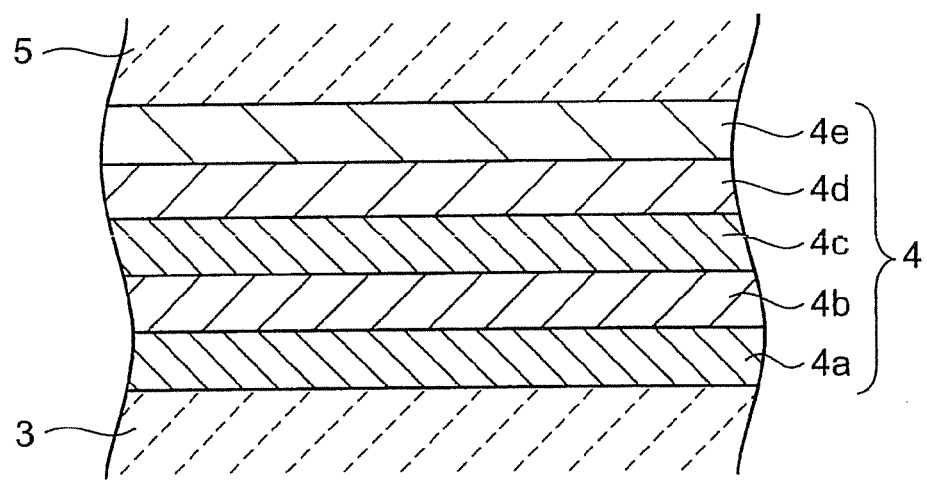
FIG. 2 is an enlarged view illustrating a light-emitting layer useful for the organic EL device shown in FIG. 1.

The blue-light-emitting layer 4 is an EL layer that emits blue light 11. When the electrode 3 serves as the anode, a hole-injection layer and a luminescent layer (luminous layer) are layered on the electrode 3 in this order, or a hole-injection layer, a luminescent layer (luminous layer), and an electron-injection layer are layered in this order on the electrode 3, or a luminescent layer (luminous layer) and an electron-injection layer are layered on the electrode 3 in this order, so as to compose the blue-light-emitting layer 4. A hole-transport layer may be formed between the hole-injection layer and the luminescent layer; and an electron-transport layer may be formed between the luminescent layer and the electron-injection layer. Further, the hole- or electron-injection layer and the luminescent layer may include a hole- or electron-transporting material. FIG. 2 is an enlarged view illustrating a blue-light-emitting layer 4 that can be used in the organic EL device shown in FIG. 1. In the example shown in FIG. 2, the blue-light-emitting layer 4 is composed of a hole-injection layer 4a, a hole-transport layer 4b, a luminescent layer (luminous layer) 4c, an electron-transport layer 4d, and an electron-injection layer 4e that are successively layered on the electrode (usually anode) 3 in the order named. However, the blue-light-emitting layer 4 shown in FIG. 2 is merely illustrative, and blue-light-emitting layers that can be used for the organic EL device of the invention are not limited to the one shown in FIG. 2.

Materials that are usually used for forming hole-injection layers, such as dyestuff materials, metal complex materials, and polymeric materials, can be used herein to form the hole-injection layer. Materials that are usually used for forming hole-transport layers, e.g., phthalocyanine and naphthalocyanine, can be used to form the hole-transport layer.

The luminescent layer (luminous layer) is formed from a luminescent-layer-forming material including a host material and a guest material. The material for forming the luminescent layer is selected such that when the organic EL emitter 2 is used with a blue color filter 8 the chromaticity of the transmitted light 12 falls in the range shown in FIG. 3 that will be described later. Although the suitable proportion of the guest material relative to the host material varies depending also on the type of the two materials, the guest material is used in an amount ranging from about 1 to 20% by weight of the host material, for example. The unit "% by weight" is used herein as a synonym for "% by mass". Although the coloring material to be used in the blue color filter should also be taken into account when selecting host and guest materials, 9,10-di-2-naphthylanthracene (DNA) can be used as the host material, and 1-tert-butyl-perylene (TBP), as the guest material, as will be described in later in Examples. Besides these two materials, other materials can also be used if they fulfill the requirements concerning chromaticity shown in FIG. 3. Examples of host materials useful herein include anthracene derivatives, arylamine derivatives, distyrylarylene derivatives, carbazole derivatives, fluorene derivatives, and spiro compounds. Examples of guest materials useful herein include perylene derivatives, pyrene derivatives, distyrylarylene derivatives, arylamine derivatives, fluorene derivatives, and iridium complexes such as FIrPic.

Examples of materials useful for the electron-transporting layer include materials that are usually used for forming electron-transport layers, such as metal complex materials, oxadiazole derivatives, triazole derivatives, and phenanthroline derivatives. Examples of materials useful for the electron-injection layer include the above-described luminescent materials for the luminescent layer, and materials that are usually used for electron-injection layers, such as aluminum and lithium fluoride.

The electrode 5 functions as the electrode opposite to the electrode 3. The electrode 5 is either a cathode or an anode, and the electrode 5 is usually formed as the cathode. Since the electrode 5 is formed on the side from which light is extracted, a transparent conductive material such as ITO (indium tin oxide), indium oxide, IZO (indium zinc oxide), $SnO_2$, or ZnO, or a semitransparent metal such as MgAg, is favorably used for the electrode 5. After forming the electrode 5, a protective layer 6 having gas-barrier properties, such as SiON film, may be favorably formed on it as shown in FIG. 1.

(Blue Color Filter)

As shown in FIG. 1, the blue color filter 8 is disposed on the above-described organic EL emitter 2, with an adhesive layer 7 between them. Specifically, the blue color filter 8 formed on a transparent substrate 9 is attached to the organic EL emitter 2 with an adhesive layer 7, with the blue color filter 8 facing the protective layer 6 formed on the organic EL emitter 2.

The transparent substrate 9 is to be situated on the light emerging side, so that, of the above-enumerated materials for the substrate 1, transparent materials excellent in light transmission properties are favorably used for the transparent substrate 9. For example, transparent substrates having excellent light transmission properties, made of glass, silica, a variety of resins, etc. can be used.

The blue color filter 8 is made up of a blue dye or a blue pigment serving as the coloring material capable of developing specified blue color, a binder resin, a solvent, and, as additional ingredients to be incorporated when necessary, such as a dispersant, a surface-active agent, a photopolymerization initiator. A suitable blue dye or a suitable blue pigment can be selected according to the blue light 11 that the blue-light-emitting layer 4 emits. Specifically, a blue dye or a blue pigment is selected such that the transmitted light 12, i.e., the blue light 11 that has passed through the blue color filter 8 after emerging from the blue-light-emitting layer 4, falls in the range shown in FIG. 3 that will be described later. Examples of such blue dyes and blue pigments are as follows.

Examples of blue dyes useful herein include methine dyes, anthraquinone dyes, azo dyes, and triarylmethane dyes and so on. Of these dyes, triarylmethane dyes are particularly preferred as will be described in later in Examples.

Pigment-dispersed color filters and dye-containing color filters are known as color filters. For liquid crystal displays, pigment-dispersed color filters, which are excellent in both light resistance and heat resistance, are usually used. The reason for this is as follows: in the production of liquid crystal displays, it is necessary to bake polyimide films serving as liquid-crystals-aligning films at high temperatures of 230° C. or more, so that it is usually impossible to use dyes, which begin to decompose at around 180° C. However, we found by earnest studies that dyes, which are inferior to pigments in heat resistance, can be used in color filters for organic EL displays, because in the production of the color filters, it is not necessary to form liquid-crystals-aligning films, and also the temperature to be exerted to the color filters is about 150° C. at the most. Dyes can be dissolved in binder resins to the extent of molecular size. Therefore, the use of dye-containing color filters is advantageous in that higher transmission can be obtained as compared with the case where pigment-dispersed color filters are used. For this reason, dyes can be favorably used in color filters for organic EL displays, though their use as coloring materials in conventional color filters for liquid crystal displays has been difficult.

Examples of blue pigments include copper-phthalocyanine blue pigments, and mixtures of copper-phthalocyanine blue pigments and dioxazine purple pigments. A pigment itself has no light transmission properties, so that its particle is divided into fine particles with diameters of around 100 nm so as to acquire light transmission properties. Since pigment-dispersed color filters have been widely used for liquid crystal displays, very many color tones have been developed up to present. Therefore, the use of pigment-dispersed color filters makes the choice of color tones wider.

Further, lake pigments (lakes) can also be used as the coloring material in the blue color filter. Lake pigments can be obtained by making solutions (usually aqueous solutions) into lakes. Making into lakes is a technique which a precipitant such as a metal salt is added to a solution containing a dyestuff (coloring matter) such as a dye so as to settle as precipitates the dyestuff in the form of insoluble fine particles (pigment). Examples of dyestuffs that can be made into lakes include acidic dyes, mordant dyes (i.e., sulfonic acid group and carboxylic acid group), natural dyes having groups that can coordinate to metals, azo dyes, and triphenylmethane dyes. In making these dyestuffs into lakes, metal salts can be favorably used as the precipitant. Similarly, basic dyes can also be made into lakes. In this case, a heteropolyacid such as phosphorus-tungsten, phosphorus-molybdenum, or phosphorus-tungsten-molybdenum can be favorably used as the precipitant. With the use of a lake, it is possible to improve the reliabilities of the blue color filter, such as heat resistance and light resistance.

In this embodiment, lake pigments obtained from triarylmethane dyes, for example, can be favorably used. Examples of such lake pigments on the market include Fanal Blue D6340 (BASF AG, Germany), Irgalite Blue TNC (CIBA-GEIGY AG, Germany), and Seikalight Blue C-718 (Dainichiseika Color & Chemicals Mfg. Co., Ltd., Japan).

Examples of binder resins to be used in the blue color filter include copolymers such as benzyl methacrylate:styrene:acrylic acid:2-hydroxyethyl methacrylate copolymer. Examples of solvents useful herein is selected include hydrocarbons such as benzene, toluene, xylene, n-butylbenzene, diethylbenzene, and tetralin; ethers such as methoxybenzene, 1,2-dimethoxybenzene, and diethylene glycol dimethyl ether; ketones such as acetone, methyl ethyl ketone, methyl isobutyl ketone, cyclohexanone, and 2,4-pentanedione; esters such as ethyl acetate, ethylene glycol monomethyl ether acetate, propylene glycol monomethyl ether acetate, propylene glycol monoethyl ether acetate, and g-butyrolactone; amide solvents such as 2-pyrrolidone, N-methyl-2-pyrrolidone, dimethylformamide, and dimethylacetamide; halogen-containing solvents such as chloroform, dichloromethane, carbon tetrachloride, dichloroethane, tetrachloroethane, trichloroethylene, tetrachloroethylene, chlorobenzene, and orthodichlorobenzene; alcohols such as t-butyl alcohol, diacetone alcohol, glycerin, monoacetin, ethylene glycol, triethylene glycol, hexylene glycol, ethylene glycol monomethyl ether, ethyl cellosolve, and butyl cellosolve; and phenols such as phenol and parachlorophenol. The above-enumerated solvents can be used singly. Alternatively, two or more of the above solvents can be used in combination. When the use of a single solvent is not enough to dissolve a resist composition, or when a solvent is likely to attack the material (making up the substrate) to which a resist is applied, it is possible to avoid these inconveniences with the use of a mixture of two or more of the above solvents. Examples of surface-active agents that are used additionally when necessary include fluorine-containing surface-active agents and nonionic surface-active agents.

A transparent protective layer (not shown in the figure) is formed on the coloring layer of the blue color filter 8, if necessary, and an adhesive layer is formed on the adhesive layer. With the adhesive layer, the blue color filter 8 is attached to the organic EL emitter 2. Examples of materials for the transparent protective layer include ultraviolet-curing acrylic resin resists. Examples of materials for the adhesive layer include ultraviolet-curing acrylic resin adhesive agents.

(Chromaticity of Light Emitted from Organic EL Device)

Figure 3:
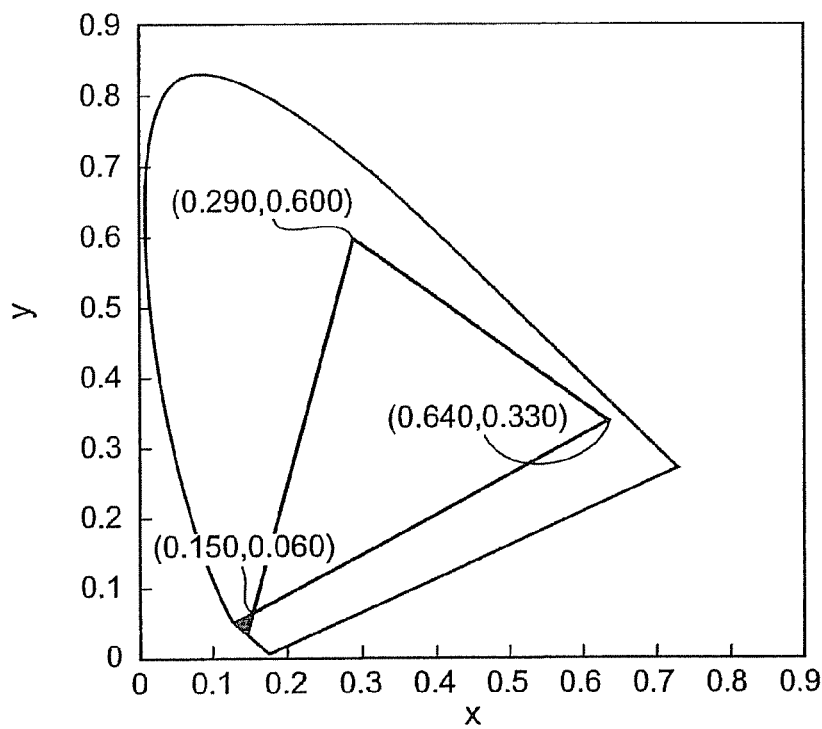
FIG. 3 shows, on the CIE chromaticity diagram, the range in which the chromaticity of the light emitted from the organic EL device shown in FIG. 1 is present.
Figure 4:
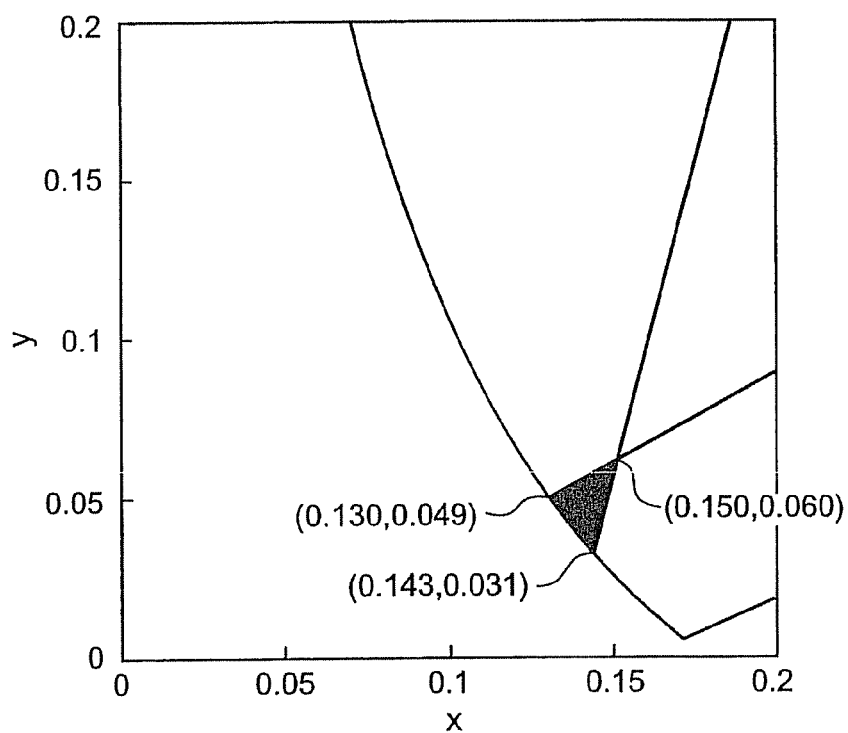
FIG. 4 is an enlarged partial view of FIG. 3.

FIG. 3 shows, on the CIE chromaticity diagram, a range in which the chromaticity of the transmitted light 12 from the organic EL device 10 is present. FIG. 4 is an enlarged partial view of FIG. 3. The characteristic feature of the present invention is that the chromaticity of the blue transmitted light 12 from the organic EL device 10 is in the triangular range defined by lines connecting three chromaticity coordinates (0.150, 0.060), (0.143, 0.031), and (0.130, 0.049) on the CIE chromaticity diagram, as is shown in FIGS. 3 and 4. If the organic EL device 10 is so made that the chromaticity of the blue transmitted light 12 falls in the above triangular range, the organic EL device 10 can cover the whole range specified in the EBU Standard when combined with a suitable organic EL device that emits green light and a suitable organic EL device that emits red light. Therefore, it is possible to compose an organic EL display excellent in color reproduction range.

The coordinates (0.150, 0.060) on the CIE chromaticity diagram is the intersection of two sides of the triangle specified in the EBU Standard. The coordinates (0.143, 0.031) and the coordinates (0.130, 0.049) are the intersections of two extended sides of the triangle specified in the EBU Standard and the CIE chromaticity diagram.

[Organic EL Display]

Figure 5:
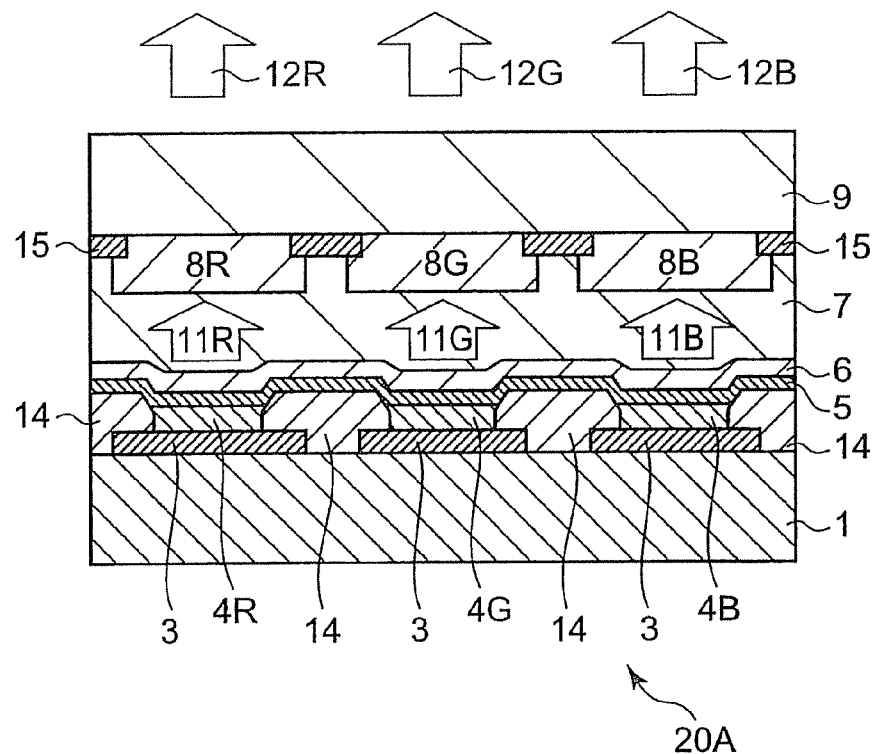
FIG. 5 is a diagrammatic sectional view showing an organic EL display in one embodiment of the present invention.

FIG. 5 is a view for explaining an embodiment of the present invention; it is a diagrammatic cross-sectional view illustrating an organic EL display. An organic EL display 20A shown in FIG. 5 is composed of an organic EL emitter 2 made by the three-color-films-coating method (three-color-films-deposition method), i.e., by coating (depositing) films of luminescent materials of three colors, e.g., blue, green, and red, and color filters corresponding to lights of the three colors to be emitted from the organic EL emitter 2. Specifically, a blue-light-emitting layer 4B, a green-light-emitting layer 4G, and a red-light-emitting layer 4R are situated on a substrate 1. The substrate 1 has walls formed thereon, and the three light-emitting layers 4B, 4G, 4R are kept separate by these walls. This organic EL display 20A comprises a substrate 1, electrodes 3, 5, a blue-light-emitting layer 4B, a protective layer 6, an adhesive layer 7, a blue color filter 8, and a transparent substrate 9, like the organic EL device 10 described above. These constituent layers of the organic EL display 20A may be the same as those of the organic EL device 10; their explanation is not repeated here.

Inorganic materials such as silicon oxide, or organic materials such as resists can be used to form the walls 14. The walls 14 are formed in a predetermined pattern after forming pattern-wise the electrode 3, before forming the light-emitting layers of three colors. For example, by coating liquids for forming the light-emitting layers of three colors, after dividing the substrate surface by the walls 14 into regions in which the light-emitting layers are to be formed, it is possible to form the light-emitting layers of three colors. Subsequently, the electrode 5 is formed to cover entirely the surfaces of the walls 14 and the surfaces of the light-emitting layers, and then the protective layer 6 having e.g., gas-barrier properties is formed on the electrode 5. The electrodes 3, 5 may be formed in either active matrix or simple matrix.

Conventional materials for green-light-emitting layers can be used to form the green-light-emitting layer 4G. Also to form the red-light-emitting layer 4R, conventional materials for red-light-emitting layers can be used. Further, conventional materials for green color filters and conventional materials for red color filters can be used to form the green color filter 8G and the red color filter 8R, respectively.

The color filter can be made by pattern-wise forming, on a transparent substrate 9, a coloring layer consisting of a black matrix layer 15 and color patterns of e.g., R (red), G (green), and B (blue), and then forming a transparent protective layer (not shown in the figure) on the surface of the coloring layer, as needed.

A photoresist or printing ink containing a black pigment and a resin, or a metal such as chrome, can be used to form the black matrix layer 15. To form the color pattern of each color, a photoresist or printing ink containing a coloring material such as a pigment or a dye that develops the color and a resin can be used. The transparent protective layer (not shown in the figure) can be formed from a polymerizable resin material by applying it to the surface of the coloring layer to form a film and then curing the film. Organic materials that can cause both polymerization reaction and cross-linking reaction can be favorably used to form the transparent protective layer. Specific examples of materials for the transparent protective material include (meth)acrylate-group-containing compounds having unsaturated double bond, epoxy-group-containing compounds, and urethane-group-containing compounds.

Some dyes are insufficient in light resistance. When using such a dye as a constituent material of the color filter, it is desirable to take a measure to prevent the dye from fading. For example, a singlet quencher may be incorporated in a coloring-layer-forming material as a means of preventing the dye from fading. Examples of quenchers that can be favorably used herein include metal complexes such as dialkyl phosphates, dialkyl carbamates, and benzene dithiol or other dithiols similar to it. Further, a quencher consisting of a metal such as nickel, copper, or cobalt can also be used for this purpose. Another means of preventing color fading is that a transparent protective layer is formed on the upper surface of the coloring layer with the use of a transparent resin. By forming the transparent protective layer, it is possible to protect the coloring layer from active components in air or in the adhesive agent used for attachment, thereby preventing the dye contained in the coloring layer from fading. To form such a transparent protective layer, ultraviolet-curing or thermosetting acrylates can be favorably used. A further effective means of preventing color fading is that a protective film capable of cutting ultraviolet components directly or indirectly is attached to the man-side surface of the color filter. This protective film can prevent unfavorable ultraviolet rays from entering the display surface, so that the dye can be prevented from fading. Preferred examples of such protective films on the market include "Arton" (trademark registered by JSR Corporation, Japan) made from norbornene resins and "UV Guard" (trademark registered by Fiji Film Co., Ltd., Japan).

This organic EL display 20A uses the organic EL device that emits blue transmitted light 12B whose chromaticity falls in the above-described range on the CIE chromaticity diagram, in combination with an organic EL device that emits green light and an organic EL device that emits red light. Therefore, when the organic EL device that emits green light and the organic EL device that emits red light are so made that they can emit specified lights, the organic EL display 20A can cover the whole range specified in the EBU Standard. Thus, there can be obtained an organic EL full-color display excellent in color reproduction range.

Figure 6:
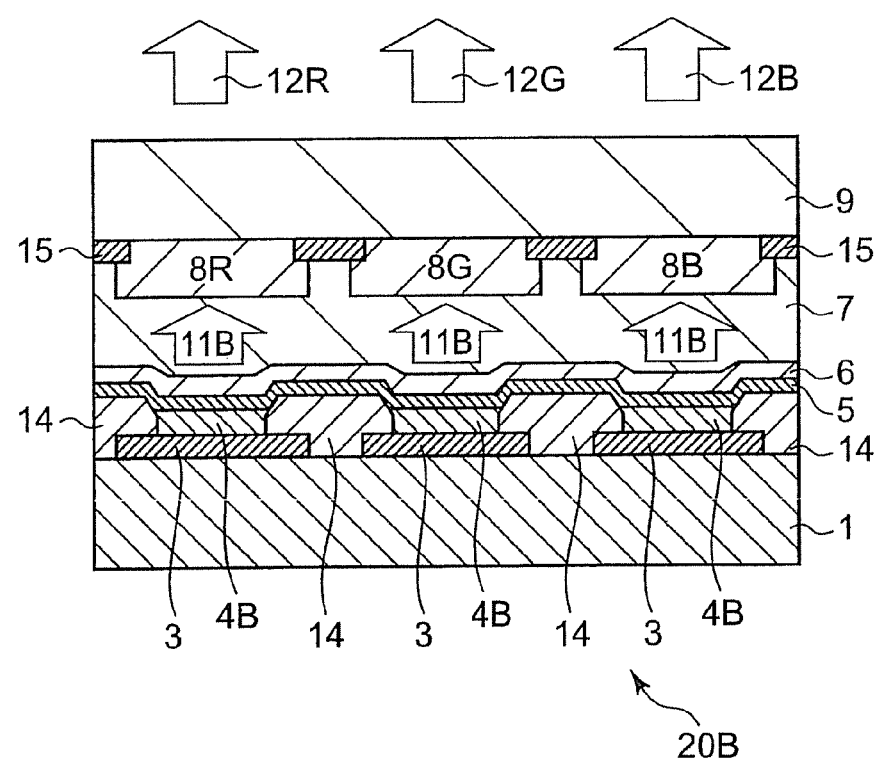
FIG. 6 is a diagrammatic sectional view illustrating one modification of the organic EL display.

FIG. 6 is a diagrammatic sectional view illustrating another organic EL display different from the one shown in FIG. 5. An organic EL display 20B shown in FIG. 6 is composed of an organic EL emitter 2 containing a blue-light-emitting layer 4B formed in red, green and blue emission regions, and a color filter having color changing layers (CCM layers) that convert the blue light 11B from the organic EL emitter 2 to lights of predetermined colors.

Specifically, a blue-light-emitting layer 4B divided by walls 14 is present in the red, green and blue emission regions on a substrate 1. On this blue-light-emitting layer 4B, an electrode 5, a protective layer 6, an adhesive layer 7, a color filter (8R, 8G, 8B) serving as a color changing layer, and a transparent substrate 9 are successively layered in the order named. The substrate 1, the electrodes 3, 5, the blue-light-emitting layer 4B, the protective layer 6, the adhesive layer 7, the blue color filter 8B, and the transparent substrate 9 that make up the organic EL display 20B shown in FIG. 6 may be the same as those of the above-described organic EL device 10; explanation of these constituent layers is not given here any more. Further, the walls 14 and the black matrix layer 15 that are contained in the organic EL display 20B shown in FIG. 6 may be the same as those in the organic EL display 20A shown in FIG. 5, so that explanation of these two are not repeated any more. Furthermore, the above-described means of preventing color fading useful for the organic EL display 20A shown in FIG. 5 can be used for the organic EL display 20B shown in FIG. 6, so that explanation of these means is not repeated here.

In this organic EL display 20B, symbol 8R designates a color filter for conversion of color from blue to red. To form this color filter 8R, conventional materials can be used. Examples of materials useful for the color filter 8R include compositions prepared by dissolving or dispersing, in resins, cyanine dyestuffs such as 4-dicyanomethylene-2-methyl-6-(p-dimethylaminostyryl)-4H-pyran, pyridine dyestuffs such as 1-ethyl-2-[4-(p-dimethylaminophenyl)-1,3-butadienyl]-pyridium-perchlorate, Rhodamine dyestuffs such as Rhodamine B or Rhodamine 6G, or oxazine dyestuffs. Symbol 8G designates a color filter for conversion of color from blue to green. Conventional materials can be used to form the color filter 8G. Examples of materials useful for the color filter 8G include compositions prepared by dissolving or dispersing, in resins, coumarin dyestuffs such as 2,3,5,6-1H,4H-tetrahydro-8-trifluoromethylquinolidino-(9,9a,1-gh)coumarin, 3-(2'-benzothiazolyl)-7-diethylaminocoumarin, or 3-(2'-benzimidazolyl)-7-N,N-diethylaminocoumarin, coumarin dyes such as Basic Yellow 51, or naphthalimide dyestuffs such as Solvent Yellow 11 or Solvent Yellow 116.

This organic EL display 20B uses the organic EL device that emits blue light 12B whose chromaticity is in the above-described range on the CIE chromaticity diagram, in combination with an organic EL device that emits green light and an organic EL device that emits red light. Therefore, when the organic EL device that emits green light and the organic EL device that emits red light are so made that they can emit specified lights, the organic EL display 20B can cover the whole range specified in the EBU Standard. Thus, there can be obtained an organic EL full-color display excellent in color reproduction range.

EXAMPLES

The present invention will now be explained more specifically with reference to the following Examples and Comparative Examples. However, Examples should not be construed as limiting the present invention.

Example 1

Production of Organic EL Emitter

Figure 7:
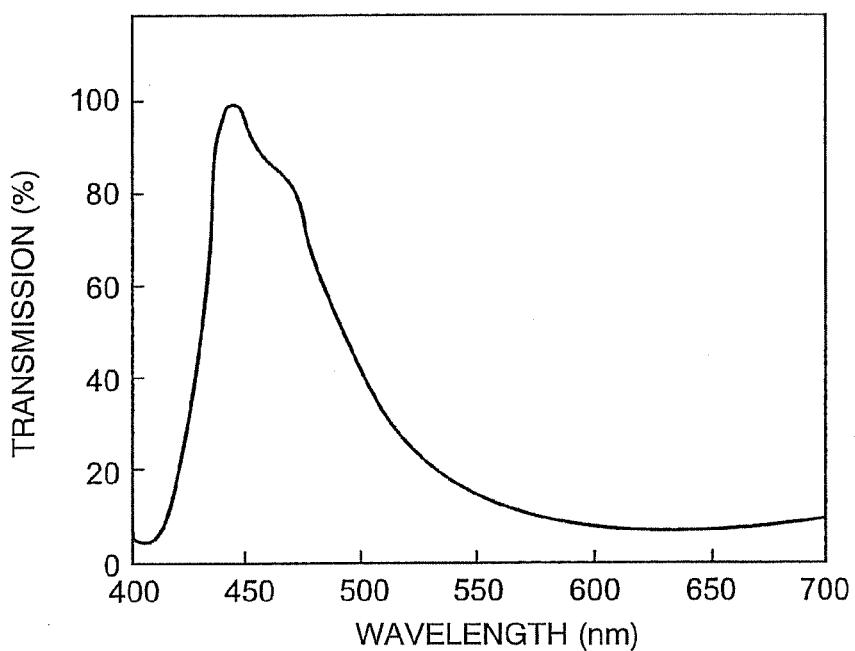
FIG. 7 is a graph showing the spectral properties of blue light that the blue-light-emitting layer used in Example 1 emits.

A non-alkali glass substrate with a thickness of 1.7 mm, having thereon a TFT as a switching device, was prepared as the substrate 1. On this non-alkali glass substrate, a reflecting electrode 3, a hole-injection layer 4a, a hole-transport layer 4b, a luminescent layer 4c, an electron-transport layer 4d, and an electron-injection layer 4e were pattern-wise formed in the order named so as to form a blue-light-emitting layer 4 (see FIG. 2). In this process, a layer with a thickness of 140 nm, having the lamination ITO (20 nm)/Ag (100 nm)/ITO (20 nm), was formed as the reflecting electrode 3. Bis(N-(1-naphthyl-N-phenyl)benzidine) (α-NPD) and $MoO_3$ were co-deposited so as to form a 40-nm thick film ($MoO_3$ content: 20% by volume), and this film was used as the hole-injection layer 4a. A 20-nm thick film of α-NPD was deposited as the hole-transport layer 4b. Using 9,10-di-2-naphthylanthracene (DNA), host material, and 1-tert-butyl-perylene (TBP), guest material, a 40-nm thick film was formed as the luminescent layer 4c. A 20-nm thick film of tris(8-quinolate)aluminum complex (Alq3) was formed as the electron-transport layer 4d, and a LiF film with a thickness of 0.5 nm, as the electron-injection layer 4e. A semitransparent cathode 5 with a thickness of 10 nm, consisting of MgAg, was further formed on the entire surface the blue-light-emitting layer 4, and then a protective layer 6 with a thickness of 100 nm was formed with the use of SiON on the entire surface of the cathode 5, thereby producing an organic EL emitter 2 that emits blue light (see FIG. 1). In forming the luminescent layer 4c, the host material and the guest material were mixed at a ratio of 20:1. FIG. 7 is a graph showing the spectral properties of the blue light emitted from the blue-light-emitting layer used in Example 1. The transmission of the blue light peaked at 445 nm, and its half maximum full width (half value breadth) was 61 nm.

(Production of Color Filter)

Coloring ink for forming a blue pattern was first prepared. In this Example, a pigment-dispersed photoresist using a pigment as the coloring material of the coloring ink was prepared. Specifically, beads were added to a dispersion composition (containing pigments, a pigment derivative, a dispersant, and a solvent) having the following formulation, and the dispersion composition was mixed with the beads in order that the beads were dispersed in the dispersion composition in a dispersion mixer (Paint Shaker manufactured by Asada Iron Works Co., Ltd., Japan) for three hours. After removing the beads, the dispersion was mixed with a clear resist composition (containing a polymer, a monomer, additives, initiators, and a solvent), thereby obtaining a blue-pattern-forming pigment-dispersed photoresist.

Pigment-Dispersed Photoresist for Forming Blue Pattern:

| | |
|---|---|
| Blue pigment (C.I. PB 15:6 ("Heliogen Blue L6700F", a phthalocyanine pigment manufactured by BASF AG, Germany)) | 4.5 parts by weight |
| Purple pigment (C.I. PV 23 ("Fostapalm RL-NF", a dioxazine pigment manufactured by Clariant Japan K.K., Japan) | 1.5 parts by weight |
| Pigment derivative ("Solsperse 12000" manufactured by ZENEKA K.K., Japan) | 0.6 parts by weight |
| Dispersant ("Solsperse 24000" manufactured by ZENEKA K.K., Japan) | 2.4 parts by weight |
| Monomer ("SR399" available from Sartomer Japan Inc., Japan) | 4.0 parts by weight |
| Polymer 1 | 5.0 parts by weight |
| Initiator ("Irgacure 907" manufactured by CIBA-GEIGY AG, Germany) | 1.4 parts by weight |
| Initiator (2,2'-bis(o-chlorophenyl)-4,5,4',5'-tetraphenyl-1,2'-biimidazole) | 0.6 parts by weight |
| Solvent (propylene glycol monomethyl ether acetate) | 80.0 parts by weight |

The above polymer 1 was an addition product obtained by adding 16.9 mol % of 2-methacryloyloxyethyl isocyanate to 100 mol % of benzyl methacrylate:styrene:acrylic acid:2-hydroxyethyl methacrylate (in the molar ratio 15.6:37.0:30.5:16.9) copolymer, and its weight-average molecular weight was 42500.

A glass substrate ("1737" manufactured by Corning Japan K.K., Japan) serving as the substrate 9 was spin-coated with the pigment-dispersed photoresist, and the photoresist film formed was pre-baked at 80° C. for 5 minutes to remove the solvent. Subsequently, the photoresist film was exposed to 300 mJ/cm² of ultraviolet light having an emission peak at 365 nm for curing, and the cured film was baked in a clean oven at 200° C. for 30 minutes, whereby a solidly formed color filter 8 was obtained. The following was confirmed: it is possible to pattern the pigment-dispersed photoresist film so that the patterned film has a line width in the order of 10 μm, by exposing it to ultraviolet light after covering it with a finely patterned photomask and then spray-developing it with a 0.1% aqueous KOH solution. In Example 1, the final thickness of the color filter 8 was 1.93 μm.

An ultraviolet-curing transparent protective layer (overcoat layer) with a thickness of 1.2 μm was photolithographically formed on the uppermost surface of the color filter 8 with the use of an ultraviolet-curing material JNPC 80 (manufactured by JSR Corporation, Japan). Arton (trademark, manufactured by JSR Corporation, Japan), a norbornene film serving as an ultraviolet protective film, was attached to the glass substrate surface on the side opposite to the color-filter-layer-formed side. In this process, the protective film was attached to the glass substrate before attaching the organic EL emitter 2 and the color filter 8 to each other. However, the protective film may be attached to the glass substrate after attaching the organic EL emitter 2 and the color filter 8 to each other.

(Production of Organic EL Device)

The color filter 8 and the organic EL emitter 2 were bonded with an adhesive agent (trade name: NT-01UV, manufactured by NITTO DENKO CORPORATION, Japan), thereby producing an organic EL device 10 of Example 1.

Comparative Example 1

The procedure of Example 1 was repeated, provided that the thickness of the color filter 8 was changed to 1.07 thereby producing an organic EL device of Comparative Example 1.

Comparative Example 2

The procedure of Example 1 was repeated, provided that the thickness of the color filter 8 was changed to 4.28 μm, thereby producing an organic EL device of Comparative Example 2.

Example 2

A color filter was made in the same manner as in Example 1, except that a dye-containing photoresist was used instead of the pigment-dispersed photoresist, and that the photoresist film, was baked in the clean oven at 180° C. for 30 minutes. Using this color filter, an organic EL device of Example 2 was produced in the same manner as in Example 1. In this Example, the final thickness of the color filter 8 was 1.26 μm. The blue-pattern-forming dye-containing photoresist was prepared by dissolving the following composition.

Dye-Containing Photoresist for Forming Blue Pattern:

| | |
|---|---|
| Blue dye ("Basonyl-Blue 636", a triarylmethane dye manufactured by BASF AG, Germany) | 6.0 parts by weight |
| Monomer ("SR399" available from Sartomer Japan Inc., Japan) | 4.0 parts by weight |
| Polymer 1 (the same as in Example 1) | 5.0 parts by weight |
| Initiator ("Irgacure 907" manufactured by CIBA-GEIGY AG, Germany) | 1.4 parts by weight |
| Initiator (2,2'-bis(o-chlorophenyl)-4,5,4',5'-tetraphenyl-1,2'-biimidazole) | 0.6 parts by weight |
| Solvent (propylene glycol monomethyl ether acetate) | 80.0 parts by weight |

Comparative Example 3

The procedure of Example 2 was repeated, provided that the thickness of the color filter 8 was changed to 0.70 μm, thereby producing an organic EL device of Comparative Example 3.

Comparative Example 4

The procedure of Example 2 was repeated, provided that the thickness of the color filter 8 was changed to 2.80 μm, thereby producing an organic EL device of Comparative Example 4.

Example 3

A color filter was made in the same manner as in Example 1, except that a lake-pigment-dispersed photoresist was used instead of the pigment-dispersed photoresist, and that the photoresist film was baked in the clean oven at 180° C. for 30 minutes. Using this color filter, an organic EL device of Example 3 was produced in the same manner as in Example 1. In this Example 3, the final thickness of the color filter 8 was 2.51 μm. The following composition was used to prepare the blue-pattern-forming lake-pigment-dispersed photoresist.

Lake-Pigment-Dispersed Photoresist for Forming Blue Pattern:

| | |
|---|---|
| Blue lake pigment ("Fanal Blue D6340" manufactured by BASF AG, Germany) | 6.0 parts by weight |
| Pigment derivative ("Solsperse 12000" manufactured by ZENEKA K.K., Japan) | 0.6 parts by weight |
| Dispersant ("Solsperse 24000" manufactured by ZENEKA K.K., Japan) | 2.4 parts by weight |
| Monomer ("SR399" available from Sartomer Japan Inc., Japan) | 4.0 parts by weight |
| Polymer 1 (the same as in Example 1) | 5.0 parts by weight |
| Initiator ("Irgacure 907" manufactured by CIBA-GEIGY AG, Germany) | 1.4 parts by weight |
| Initiator (2,2'-bis(o-chlorophenyl)-4,5,4',5'-tetraphenyl-1,2'-biimidazole) | 0.6 parts by weight |
| Solvent (propylene glycol monomethyl ether acetate) | 80.0 parts by weight |

Comparative Example 5

The procedure of Example 3 was repeated, provided that the thickness of the color filter 8 was changed to 1.85 µm, thereby producing an organic EL device of Comparative Example 5.

Comparative Example 6

The procedure of Example 3 was repeated, provided that the thickness of the color filter 8 was changed to 4.11 µm, thereby producing an organic EL device of Comparative Example 6.

Method and Results of Evaluation

Chromaticity was evaluated based on the color difference ΔE94 (CIE 1994). Chromaticity was obtained by making measurement of the emission spectrum of the organic EL device with a spectroradiometer (type: SR-2) manufactured by Topcon Corp., Japan, and performing a calculation with a calculation soft installed in the spectroradiometer. Measurement of a spectrum distribution was made with a microscopic spectrocolorimeter (type: OSP-SP200) manufactured by OLYMPUS OPTICAL CO., LTD., Japan.

Figure 8:
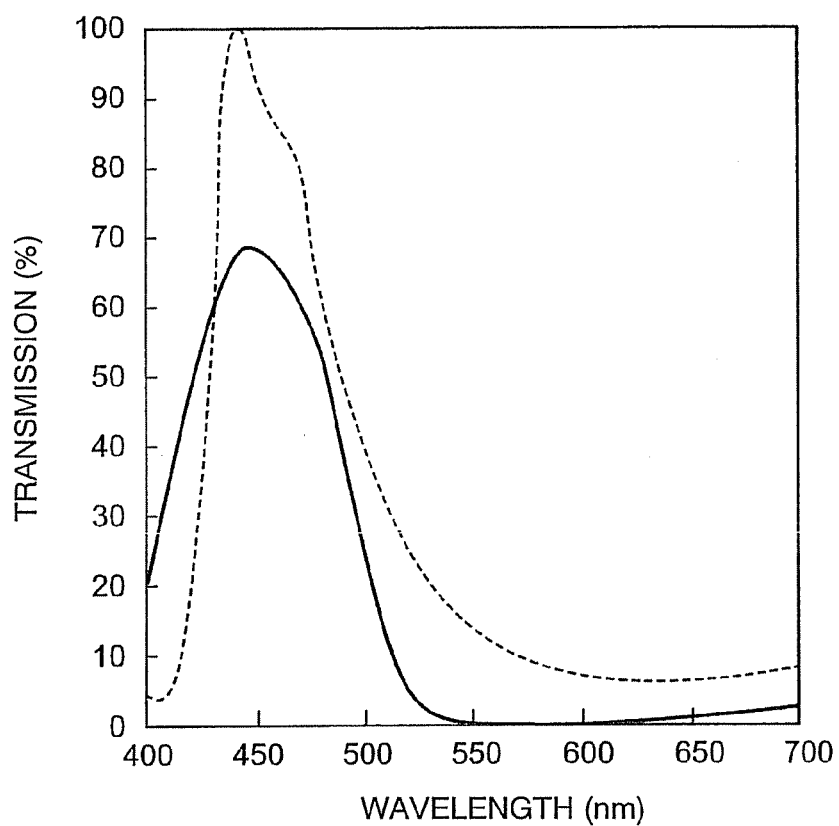
FIG. 8 is a graph showing the spectral properties of the organic EL device of Example 1.
Figure 9:
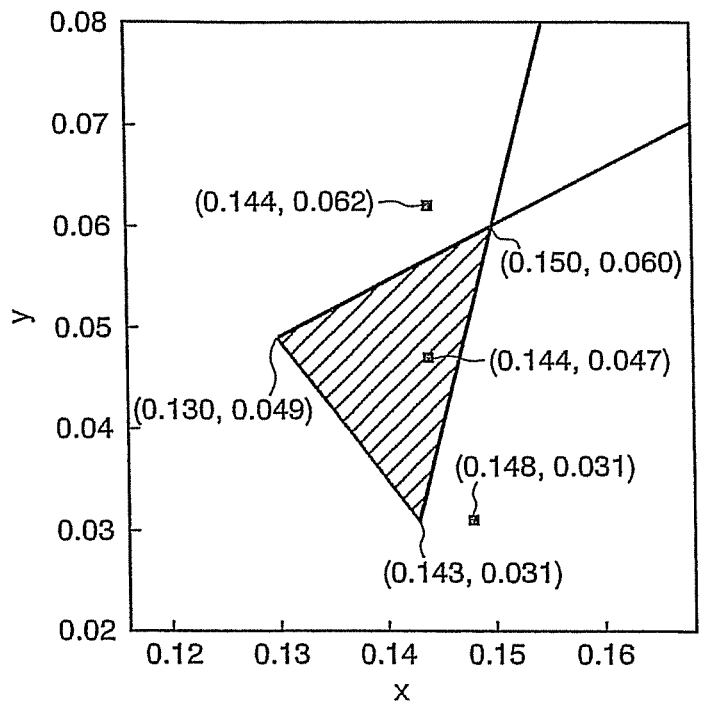
FIG. 9 is a graph showing the spectral properties of the blue light emitted from the organic EL device of Example 1, the spectral properties of the blue light emitted from the organic EL device of Comparative Example 1, and the spectral properties of the blue light emitted from the organic EL device of Comparative Example 2.

FIG. 8 is a graph showing the spectral properties of the organic EL device of Example 1. The broken line in FIG. 8 shows the spectral properties shown in FIG. 7. FIG. 9 is a graph showing the CIE chromaticity of the blue light emitted from the organic EL device of Example 1, the CIE chromaticity of the blue light emitted from the organic EL device of Comparative Example 1, and the CIE chromaticity of the blue light emitted from the organic EL device of Comparative Example 2. The chromaticity of the blue light emitted from the organic EL device of Example 1 was (0.144, 0.047); it was within the above-described ideal range on the CIE chromaticity diagram, that is to say, within the triangular range defined by lines connecting three chromaticity coordinates (0.150, 0.060), (0.143, 0.031), and (0.130, 0.049) on the CIE chromaticity diagram. On the other hand, the chromaticity of the blue light emitted from the organic EL device of Comparative Example 1 was (0.144, 0.062), and the chromaticity of the blue light emitted from the organic EL device of Comparative Example 2 was (0.148, 0.031). Both the former chromaticity and the latter one were not in the triangular range defined by lines connecting three chromaticity coordinates (0.150, 0.060), (0.143, 0.031), and (0.130, 0.049) on the CIE chromaticity diagram.

Figure 10:
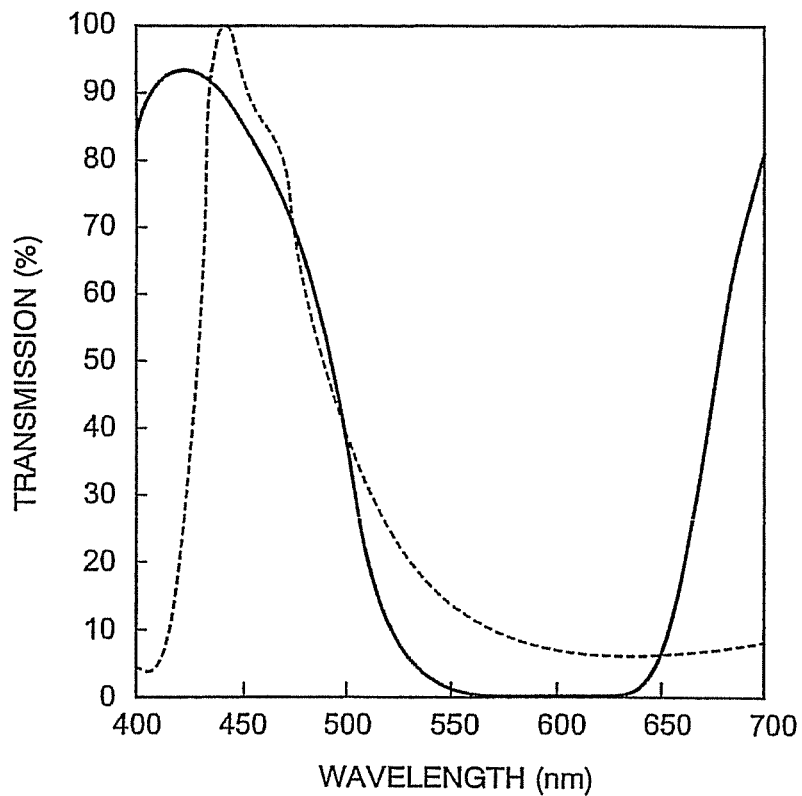
FIG. 10 is a graph showing the spectral properties of the organic EL device of Example 2.
Figure 11:
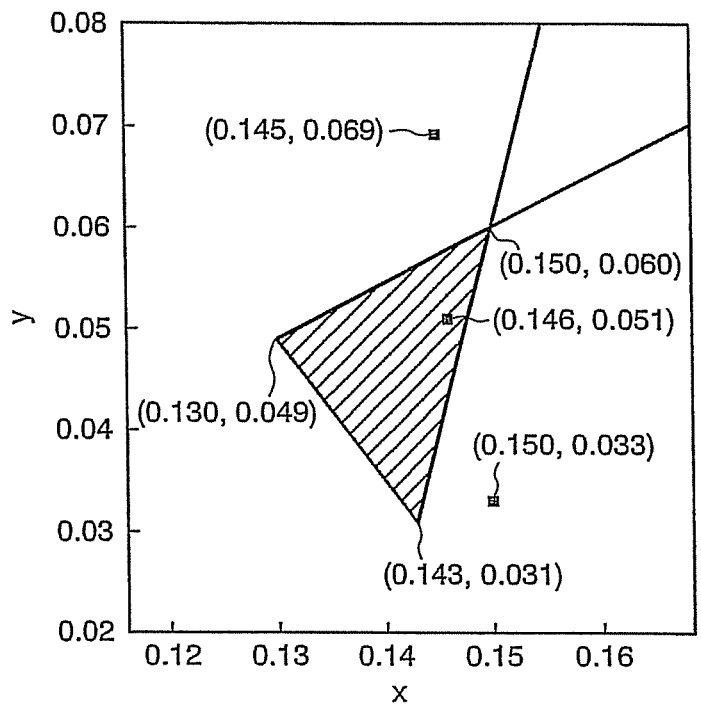
FIG. 11 is a graph showing the spectral properties of the blue light emitted from the organic EL device of Example 2, the spectral properties of the blue light emitted from the organic EL device of Comparative Example 3, and the spectral properties of the blue light emitted from the organic EL device of Comparative Example 4.

FIG. 10 is a graph showing the spectral properties of the organic EL device of Example 2. The broken line in FIG. 10 shows the spectral properties shown in FIG. 7. FIG. 11 is a graph showing the CIE chromaticity of the blue light emitted from the organic EL device of Example 2, the CIE chromaticity of the blue light emitted from the organic EL device of Comparative Example 3, and the CIE chromaticity of the blue light emitted from the organic EL device of Comparative Example 4. The chromaticity of the blue light emitted from the organic EL device of Example 2 was (0.146, 0.051); it was within the above-described ideal range on the CIE chromaticity diagram, that is to say, within the triangular range defined by lines connecting three chromaticity coordinates (0.150, 0.060), (0.143, 0.031), and (0.130, 0.049) on the CIE chromaticity diagram. On the other hand, the chromaticity of the blue light emitted from the organic EL device of Comparative Example 3 was (0.145, 0.069), and the chromaticity of the blue light emitted from the organic EL device of Comparative Example 4 was (0.150, 0.033). Both the former chromaticity and the latter one were not in the triangular range defined by lines connecting three chromaticity coordinates (0.150, 0.060), (0.143, 0.031), and (0.130, 0.049) on the CIE chromaticity diagram.

Figure 12:
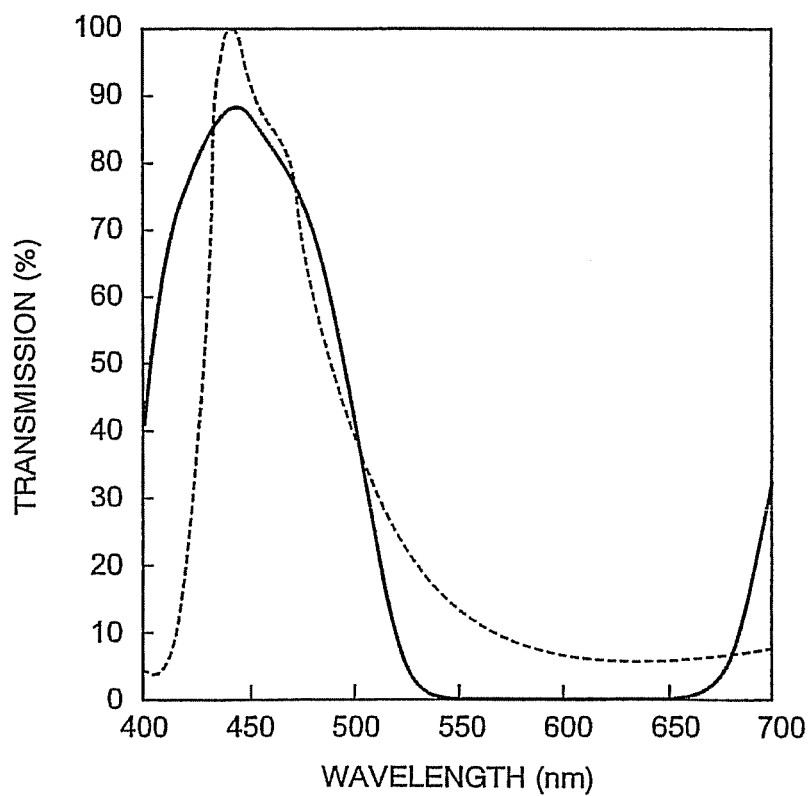
FIG. 12 is a graph showing the spectral properties of the organic EL device of Example 3.
Figure 13:
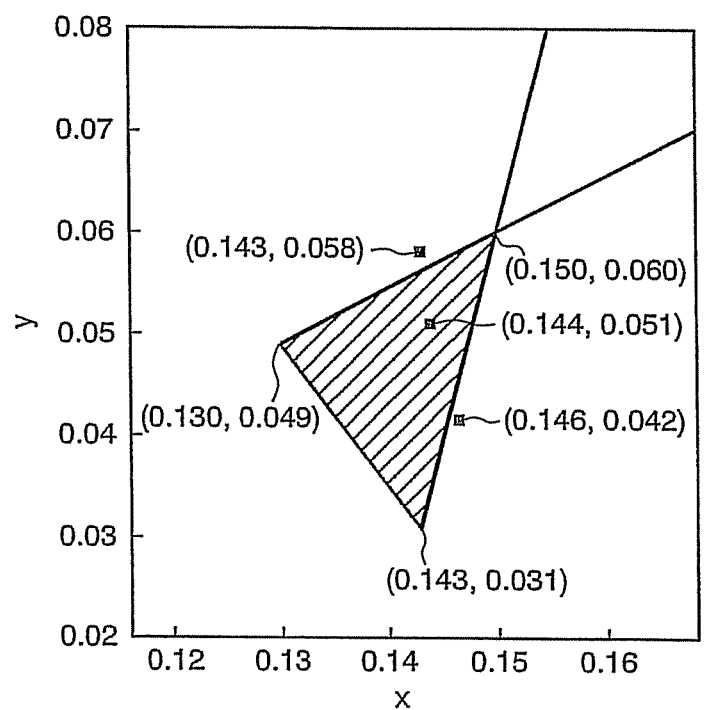
FIG. 13 is a graph showing the spectral properties of the blue light emitted from the organic EL device of Example 3, the spectral properties of the blue light emitted from the organic EL device of Comparative Example 5, and the spectral properties of the blue light emitted from the organic EL device of Comparative Example 6.

FIG. 12 is a graph showing the spectral properties of the organic EL device of Example 3. The broken line in FIG. 12 shows the spectral properties shown in FIG. 7. FIG. 13 is a graph showing the CIE chromaticity of the blue light emitted from the organic EL device of Example 3, the CIE chromaticity of the blue light emitted from the organic EL device of Comparative Example 5, and the CIE chromaticity of the blue light emitted from the organic EL device of Comparative Example 6. The chromaticity of the blue light emitted from the organic EL device of Example 3 was (0.144, 0.051); it was within the above-described ideal range on the CIE chromaticity diagram, that is to say, within the triangular range defined by lines connecting three chromaticity coordinates (0.150, 0.060), (0.143, 0.031), and (0.130, 0.049) on the CIE chromaticity diagram. On the other hand, the chromaticity of the blue light emitted from the organic EL device of Comparative Example 5 was (0.143, 0.058), and the chromaticity of the blue light emitted from the organic EL device of Comparative Example 6 was (0.146, 0.042). Both the former chromaticity and the latter one were not in the triangular range defined by lines connecting three chromaticity coordinates (0.150, 0.060), (0.143, 0.031), and (0.130, 0.049) on the CIE chromaticity diagram.

The invention claimed is:

1. An organic EL device comprising:
   an organic EL emitter that emits blue light; and
   a blue color filter through which the light emitted from the organic EL emitter passes;
   wherein the blue color filter includes a lake pigment coloring material; and
   wherein the chromaticity of light that has passed through the blue color filter after being emitted from the organic EL emitter falls in the range defined by lines connecting three chromaticity coordinates (0.150, 0.060), (0.143, 0.031), and (0.130, 0.049) on the CIE chromaticity diagram.

2. A color filter to be combined with an organic EL emitter that emits blue light so as to compose an organic EL device, the color filter comprising:
   a binder resin; and
   a lake pigment coloring material;
   wherein the chromaticity of light that has passed through the blue color filter after being emitted from the organic EL emitter falls in the range defined by lines connecting three chromaticity coordinates (0.150, 0.060), (0.143, 0.031), and (0.130, 0.049) on the CIE chromaticity diagram.

3. An organic EL display comprising:

an organic EL device that emits red light;
an organic EL device that emits green light; and
an organic EL device that emits blue light;
wherein the organic EL device that emits blue light includes
- an organic EL emitter that emits blue light, and
- a blue color filter through which the light emitted from the organic EL emitter passes,
- wherein the blue color filter includes a lake pigment coloring material, and
- wherein the chromaticity of light that has passed through the blue color filter after being emitted from the organic EL emitter falls in the range defined by lines connecting three chromaticity coordinates (0.150, 0.060), (0.143, 0.031), and (0.130, 0.049) on the CIE chromaticity diagram.

* * * * *